(12) United States Patent
Carroll et al.

(10) Patent No.: US 6,977,509 B2
(45) Date of Patent: Dec. 20, 2005

(54) SYSTEM AND METHOD FOR HIGH VOLTAGE TESTING OF TWISTED INSULATED CONDUCTORS

(75) Inventors: David L. Carroll, Branford, CT (US); Theodore P. Lane, Clinton, CT (US); Thomas Listorti, Old Saybrook, CT (US); Matthew D. Corcoran, Clinton, CT (US)

(73) Assignee: Clinton Instrument Company, Clinton, CT (US)

( * ) Notice: Subject to any disclaimer, the term of this patent is extended or adjusted under 35 U.S.C. 154(b) by 0 days.

(21) Appl. No.: 10/802,227

(22) Filed: Mar. 17, 2004

(65) Prior Publication Data

US 2005/0206393 A1   Sep. 22, 2005

(51) Int. Cl.⁷ ............... G01R 31/02; G01R 31/08; G01R 31/12; H01H 9/50
(52) U.S. Cl. ............... 324/544; 324/541; 324/536
(58) Field of Search .............. 324/544, 541–543, 324/538–539, 512, 516, 536

(56) References Cited

U.S. PATENT DOCUMENTS

| 3,763,426 | A | * | 10/1973 | Wilkes | 324/515 |
| 3,945,182 | A | | 3/1976 | Dover et al. | 324/516 |
| 4,056,771 | A | | 11/1977 | Clinton et al. | 57/58.52 |
| 4,241,304 | A | * | 12/1980 | Clinton | 324/516 |
| 4,313,085 | A | * | 1/1982 | Balchunas | 324/516 |
| 5,594,176 | A | * | 1/1997 | Kiefer | 73/623 |
| 5,712,889 | A | * | 1/1998 | Lanzara et al. | 378/19 |
| 5,933,289 | A | * | 8/1999 | Sano et al. | 360/77.16 |

OTHER PUBLICATIONS

PCT International Search Report PCT/US05/08816, Dated Jun. 22, 2005.

* cited by examiner

Primary Examiner—Anjan Deb
Assistant Examiner—Amy He
(74) Attorney, Agent, or Firm—McCormick, Paulding & Huber LLP

(57) ABSTRACT

A system and method for high voltage testing of twisted insulated conductors includes a high voltage power supply to be disposed within a rotating mechanism of a twinner. An electrode is coupled to the power supply and is to be disposed adjacent to a take-up reel within the rotating mechanism of the twinner. The electrode is for generating sparks between the electrode and the twisted insulated conductors when a fault in the insulation of the twisted conductors, when being wound on the take-up reel, passes by the electrode. A transmitter is to be disposed within the rotating mechanism for transmitting a signal carrying information representative of fault detection characteristics of the twisted insulated conductors. The information is derived from the sparks generated between the electrode and the twisted insulated conductors. A receiver is to be disposed outside of the rotating mechanism for receiving the signal from the transmitter.

25 Claims, 1 Drawing Sheet

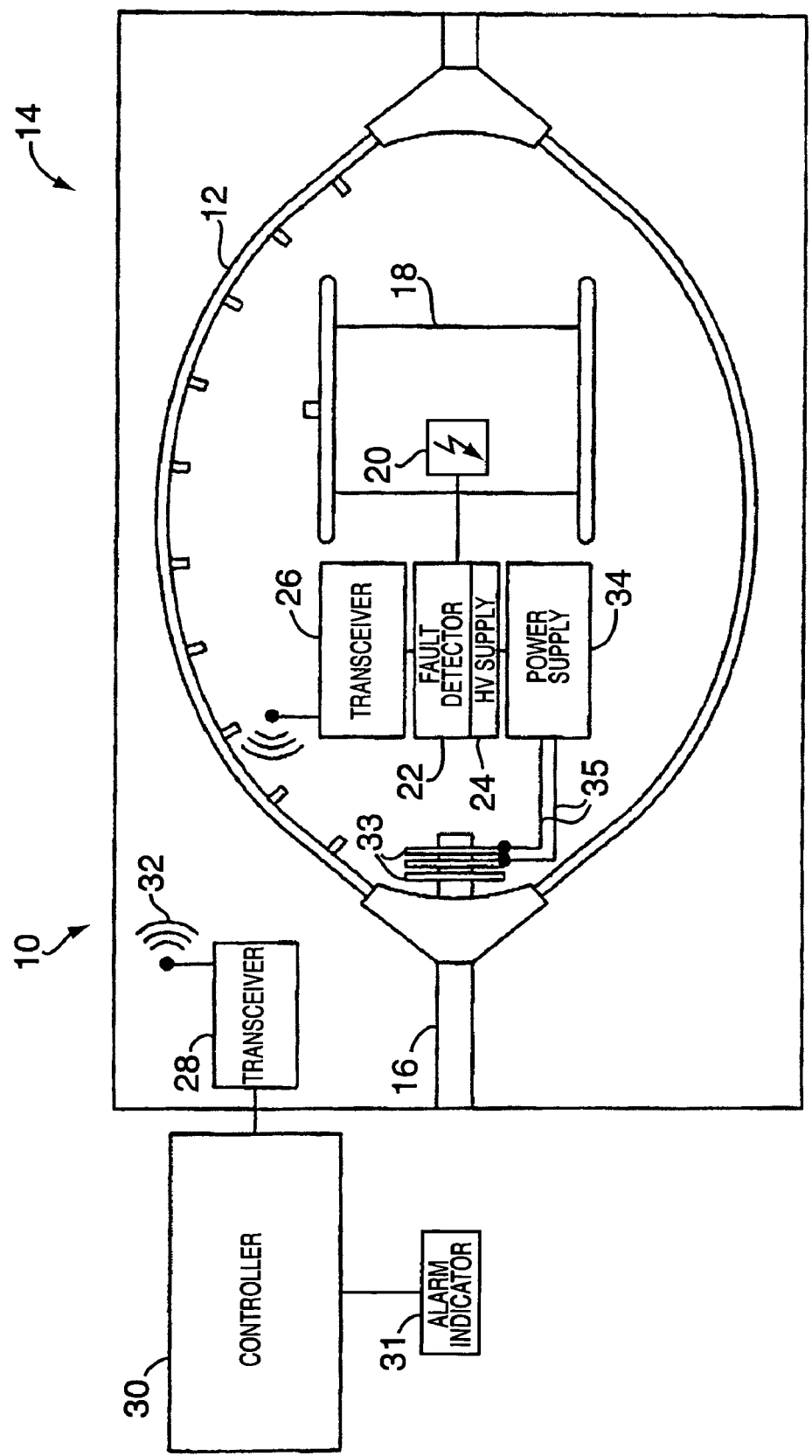
Figure

SYSTEM AND METHOD FOR HIGH VOLTAGE TESTING OF TWISTED INSULATED CONDUCTORS

FIELD OF THE INVENTION

This invention relates generally to spark testers, and more particularly to spark testers and methods for testing electrical cabling disposed within a rotating mechanism of a bow twinner.

BACKGROUND OF THE INVENTION

In the wire and cable industry, two or more insulated conductors can be twisted together to form twisted conductors. Twisted conductors, in particular a twisted pair of conductors, are the basic component of many types of multi-conductor cables. The manufacture of a twisted pair is accomplished through the use of a machine called a "bow twinner" or pairing machine, and while there are several ways in which two conductors can be twisted together, one method has enjoyed widespread popularity. In this method, the individual conductors are fed from stationary spools or pay-offs through guides to a take-up reel that is mounted inside of a gimbal-like assembly or cradle about which rotates a member called a bow. The bow is rotated about an axis along which the insulated conductors are fed from the spools to effect a twisting of the wires before they are wound on the take-up reel. One machine which operates in this manner is shown and described in U.S. Pat. No. 3,945,182, the disclosure of which is herein incorporated by reference in its entirety.

One test that the twisted pair must pass prior to shipment or use in other multi-conductor cables is an insulation test in which a high electrical potential is applied between the surface of the insulation and the conductors. If the insulation is defective because of, for example, an insulation break caused by the twisting process, a spark will jump from the point of application through the defect to the conductor. Such testing is commonly called "spark testing" by which defects in the insulation can be sensed, counted and measured through the pulse of current manifested by the spark.

It is most desirable to spark test the twisted pair as they are wound on the take-up reel in order to save time and keep productions costs down. However, the only place that the wires exist as a twisted pair is inside the rotating bow, just before they are wound on the take-up reel. This presents certain problems in the spark testing of the wire.

One problem is that the high potential test electrode must be inside the bow, where space is limited, and there can be no directly wired connections to the electrode because of the bow rotation around the test components mounted on a cradle of a twinner. Since the bow rotates around a cradle of a twinner where test components are located, any power or control wiring must be brought to the cradle using slip ring assemblies through the shaft around which the bow rotates. Space limitations on existing machines dictate that only two low voltage slip rings are available for this purpose. A device of this type is described in U.S. Pat. No. 4,056,771, the disclosure of which is herein incorporated by reference in its entirety. Prior to this, because of the many functions a spark tester may be called upon to serve, earlier designs for spark testers had controls and indicators inside the twinning bow. Adjustment of the spark tester controls was inconvenient and time consuming because the high inertia machinery had to be stopped each time an adjustment was made and then restarted.

Controlling a spark tester through slip ring assemblies provides a solution to this problem, but imposes limitations to the successful application of the test equipment. Retrofitting existing machinery to add a spark tester was very difficult because if the necessary slip rings were not available, adding them required extensive machinery modifications which are costly and difficult. Spark testers, when located within the bow of a twinner, have traditionally required up to three slip ring assemblies. Most often the equipment had to be designed and built to incorporate the spark tester. Slip rings are subject to wear and require regular maintenance. Often they do not provide uninterrupted signal contact, thereby resulting in poor spark tester performance.

The present invention overcomes these difficulties by locating all controls and indicators at a suitable remote location, outside of the rotating mechanism, so that adjustments can be made as the machinery is operated, and by locating the high potential components and fault detection circuitry within the rotating mechanism, and energizing these components using power already available within the mechanism. Communication between the control portion and the high voltage fault detector is accomplished by use of radio frequency serial transceivers. Other objects of the invention are to utilize available power within the rotating mechanism to eliminate the need for retrofitting a twinner with dedicated and costly slip ring assemblies.

Accordingly, it is an object of the present invention to provide a spark tester and method of use which overcomes the above-mentioned drawbacks and disadvantages associated with the operation of a spark tester within the rotating bow of a twinner.

SUMMARY OF THE INVENTION

In one aspect of the present invention, a system for high voltage testing of twisted insulated conductors includes a high voltage power supply to be disposed within a rotating mechanism of a twinner. An electrode is coupled to the high voltage power supply and is to be disposed adjacent to a take-up reel within the rotating mechanism of the twinner. The electrode is for generating sparks between the electrode and the twisted insulated conductors when a fault in the insulation of the conductors, when being wound on the take-up reel, passes by the electrode. A transmitter is to be disposed within the rotating mechanism for transmitting a signal carrying information representative of fault detection characteristics of the twisted insulated conductors. The information is derived from the sparks generated between the electrode and the twisted insulated conductors. A receiver is to be disposed outside of the rotating mechanism for receiving the signal from the transmitter.

In another aspect of the present invention, a method of high voltage testing of twisted insulated conductors includes the steps of providing an electrode adjacent to twisted insulated conductors wound on a take-up reel within the rotating mechanism of a twinner. A high voltage power supply is provided within the rotating mechanism. The high voltage power supply energizes the electrode as the twisted insulator conductors pass by the electrode and are wound on the take-up reel. A spark is generated between the electrode and the twisted insulated conductors when a fault in the insulation of the twisted insulated conductors passes by the electrode. An electromagnetic signal carrying information representative of fault detection characteristics of the twisted insulated conductors is transmitted to a location outside of the rotating mechanism.

BRIEF DESCRIPTION OF THE DRAWING

The sole FIGURE schematically illustrates a system for the high voltage testing of twisted insulated conductors in accordance with the present invention.

DETAILED DESCRIPTION OF THE PREFERRED EMBODIMENT

Referring to the FIGURE, a system for the high voltage testing of twisted insulated conductors in accordance with the present invention (hereinafter referred to as "spark tester") is indicated generally by the reference number 10. The spark tester 10 is to be partly disposed within a rotating mechanism or bow 12 of a conventional bow twinner or pairing machine indicated generally by the reference number 14. The twinner 14 includes a hollow shaft 16 for feeding separate insulated conductors (not shown) which are twisted together by means of the rotating mechanism 12 and then wound onto a take-up reel 18. The twinner 14, not forming part of the invention, is illustrated in a simplified form for the purpose of clarity. A more detailed discussion of how a bow twinner operates can be found in U.S. Pat. No. 3,945,182, the disclosure of which is herein incorporated by reference in its entirety.

The spark tester 10 includes components to be disposed both within and outside of the rotating mechanism 12 of the twinner 14. The components to be disposed within the rotating mechanism 12 include a high voltage or contact electrode 20 to be disposed on a conventional cradle (not shown) of the twinner 14 and adjacent to the take-up reel 18. The components to be disposed within the rotating mechanism 12 further include a fault detector 22, a high voltage power supply 24, and a transmitter preferably in the form of a first transceiver 26. Although the fault detector 22 and the high voltage power supply 24 are shown as one unit, it should be understood that the fault detector and the high voltage power supply can be physically separate units without departing from the scope of the present invention.

The components to be disposed outside of the rotating mechanism 12 include a receiver preferably in the form of a second transceiver 28, and a controller 30 such as, for example, a microprocessor based programmable logic controller (PLC). The first and second transceivers 26, 28 permit bidirectional communication to enable the controller 30 to control system status such as, for example, by adjusting the test voltage, and to enable the controller to monitor fault data. Preferably, the transceivers 26, 28 are radio frequency (RF) transceivers. However, the transceivers 26, 28 can be other types of transceivers for transmitting and receiving electromagnetic signals such as, for example, infrared (IR) or optical frequency transceivers without departing from the scope of the present invention.

The high voltage power supply 24 is a high potential DC power supply. The high voltage power supply 24 is provided with first and second output terminals having a voltage potential therebetween which is preferably adjustable, for example, from approximately 200 volts DC to approximately 10 kilovolts DC during the testing of two or more insulated conductors that are twisted together (hereinafter referred to as "the twisted insulated conductors"). Typically twinners in telephone and data cable manufacture twist two insulated conductors together into a "twisted pair". Although the system 10 will be described with regard to the detection of faults in twisted pairs, it should be understood that the system 10 can be used to detect faults in twisted insulated conductors including three or more conductors without departing from the scope of the present invention.

The electrode 20 is connected to either the negative or high potential terminal of the high voltage power supply 24 and is supported by a cradle within the rotating mechanism 12 to apply the high voltage potential to the insulation of the twisted pair. The electrode 20 is disposed adjacent to the take-up reel 18 and preferably at a location immediately before the twisted insulated conductors are wound on the take-up reel. Thus, insulation faults are detected at the critical moment before the twisted conductors are wound onto the take-up reel 18. The other terminal of the high voltage power supply 24 is preferably connected through an electrical resistance to ground potential. The wires within the twisted conductors are also connected to ground potential so that spark discharges between the electrode 20 and the conductors produce current pulses flowing between the terminals of the high voltage power supply 24. The electrode 20 can include conventional strings of beads or a brush which rest on the insulation of the twisted pair as they are wound onto the take-up reel 18 of the twinner 14.

The fault detector 22 comprises a current detector including, for example, a microammeter, that is connected with one of the output terminals of the high voltage power supply 24—preferably the terminal which is not connected to the electrode 20—and produces a low voltage output signal indicative of current flowing between the terminals of the high voltage power supply. A spark emanates from the electrode 20 because of a fault in or other damage to the insulation of the twisted pair caused by the twisting process, and in turn a step increase in the current signal occurs.

The fault detector 22 further includes conventional circuitry that analyzes the current signal for the purpose of measurement, counting or other detecting functions commonly used with spark testers. The fault detector 22 can include determination of fault detection characteristics including, for example, pin hole faults, larger faults such as bare wire intervals, the number of faults, and whether pin hole or other types of faults exceed a predetermined total number or number per unit length of twisted conductors passing by the electrode 20 while being wound on the take-up reel 18. A bare wire interval is typically defined as a single fault count maintained over a predetermined time interval as the twisted insulated conductors pass by the electrode 20. An alarm indicator 31, preferably disposed on an exterior surface of the twinner 14, activates an alarm to alert the operator when faults have been detected or a predetermined number of faults has been exceeded. Such faults for activating the alarm indicator 31 can include, for example, a predetermined number of pin hole faults, and a single bare wire interval. The alarm can be audible, visual or both. The alarm indicator 30 is preferably part of the controller 30, but can be a separate unit coupled to the controller without departing from the scope of the present invention.

The fault detector 22 is coupled to the first transceiver 26 for transmitting an electromagnetic signal 32 carrying information representative of fault detection characteristics of the twisted conductors to a location outside of the rotating mechanism 12 of the twinner 14, preferably using a radio frequency or infrared serial link. As shown in the FIGURE, the first transceiver 26 disposed within the rotating mechanism 12 transmits the electromagnetic signal 32 carrying the information to the second transceiver 28 disposed outside of the rotating mechanism 12. The second transceiver 28 is coupled to the controller 30 which processes the information carried by the signal 32.

Low voltage electrical power can also be transmitted through a rotating coupling such as slip rings 33 to supply electrical power via lines 35 to a low voltage power supply 34 disposed within the rotating mechanism 12 to energize the high voltage power supply 24 and other low voltage electrical components of the system 10 disposed within the rotating mechanism. Alternatively, low voltage electrical power can be available from other conventional sources within the rotating mechanism of a twinner. Thus, all high potential parameters can be confined to the region within the rotating mechanism 12, and control and monitoring functions can be handled using the same serial link by the controller 30 disposed at a remote location outside of the rotating mechanism 12. Because the system 10 employs electromagnetic or wireless transmission of fault detection information from a location within the rotating mechanism 12 of the twinner 14 to a location outside of the rotating mechanism, the twinner does not need to be retrofitted or otherwise modified to include additional and potentially unreliable slip rings in order to convey the fault information outside of the rotating mechanism.

As will be recognized by those of ordinary skill in the pertinent art, numerous modifications and substitutions may be made to the above-described embodiment of the present invention without departing from the scope of the invention. Accordingly, the preceding portion of this specification is to be taken in an illustrative, as opposed to a limiting sense.

What is claimed is:

1. A system for high voltage testing of twisted insulated conductors, comprising:
    a high voltage power supply to be disposed within a rotating mechanism of a twinner;
    an electrode coupled to the high voltage power supply and to be disposed adjacent to a take-up reel within the rotating mechanism of the twinner, the electrode for generating sparks between the electrode and the twisted insulated conductors when a fault in the insulation of the conductors, when being wound on the take-up reel, passes by the electrode;
    a transmitter to be disposed within the rotating mechanism for transmitting an electromagnetic wave signal carrying information representative of fault detection characteristics of the twisted insulated conductors, the information being derived form the sparks generated between the electrode and the twisted insulated conductors; and
    a receiver to be disposed outside of the rotating mechanism for receiving the electromagnetic wave signal from the transmitter.

2. A system as defined in claim 1, further comprising a fault detector to be disposed within the rotating mechanism, the fault detector communicating with at least one terminal of the high voltage power supply for detecting an increase in current across terminals of the high voltage power supply indicative of a fault in the insulation of the twisted insulated conductors being tested by the electrode and for thereupon generating the information representative of fault detection characteristics of the twisted insulated conductors.

3. A system as defined in claim 1, wherein the high voltage power supply is a DC power supply.

4. A system as defined in claim 3, wherein the high voltage power supply is adjustable for generating a voltage potential from approximately 200 volts to approximately 10 kilovolts.

5. A system as defined in claim 1, further comprising a controller coupled to the receiver for processing the information representative of fault detection characteristics of the twisted insulated conductors.

6. A system as defined in claim 5, wherein the controller is a microprocessor based programmable logic controller.

7. A system as defined in claim 5, wherein the controller includes an alarm indicator for activating at least one of an audible alarm and a visual alarm when faults have been detected or a predetermined number of faults has been exceeded.

8. A system as defined in claim 1, wherein the transmitter is a first transceiver, and the receiver is a second transceiver.

9. A system as defined in claim 8, wherein the first and second transceivers are radio frequency transceivers.

10. A system as defined in claim 8, wherein the first and second transceivers are infrared transceivers.

11. A system as defined in claim 8, wherein the first and second transceivers are optical transceivers.

12. A system as defined in claim 1, further comprising a low voltage power supply to be disposed within the rotating mechanism for energizing the high voltage power supply.

13. A system as defined in claim 1, wherein the fault detection characteristics include at least one of pin hole faults, bare wire intervals, whether the detected faults exceed a predetermined number, and whether the detected faults exceed a predetermined number per unit length of the twisted insulated conductors being tested.

14. A method of high voltage testing of twisted insulated conductors, comprising the steps of:
    providing an electrode adjacent to twisted insulated conductors wound on a take-up reel within the rotating mechanism of a twinner;
    providing a high voltage power supply within the rotating mechanism;
    energizing the electrode by means of the high voltage power supply as the twisted insulator conductors pass by the electrode and are wound on the take-up reel such that a spark is generated between the electrode and the twisted insulated conductors when a fault in the insulation of the twisted insulated conductors passes by the electrode; and
    transmitting an electromagnetic wave signal carrying information representative of fault detection characteristics of the twisted insulated conductors from a location within the rotating mechanism to a location outside of the rotating mechanism.

15. A method as defined in claim 14, wherein the step of transmitting includes transmitting the signal from a transmitter disposed within the rotating mechanism to a receiver disposed outside of the rotating mechanism.

16. A method as defined in claim 14, wherein the step of transmitting includes transmitting the signal from a radio frequency transmitter disposed within the rotating mechanism to a radio frequency receiver disposed outside of the rotating mechanism.

17. A method as defined in claim 14, wherein the step of transmitting includes transmitting the signal from a first radio frequency transceiver disposed within the rotating mechanism to a second radio frequency transceiver disposed outside of the rotating mechanism.

18. A method as defined in claim 14, wherein the step of transmitting includes transmitting the signal from an infrared transmitter disposed within the rotating mechanism to an infrared receiver disposed outside of the rotating mechanism.

19. A method as defined in claim 14, wherein the step of transmitting includes transmitting the signal from a first infrared transceiver disposed within the rotating mechanism to a second infrared transceiver disposed outside of the rotating mechanism.

20. A method as defined in claim 14, wherein the step of transmitting includes transmitting the signal from an optical frequency transmitter disposed within the rotating mechanism to an optical frequency receiver disposed outside of the rotating mechanism.

21. A method as defined in claim 14, wherein the step of transmitting includes transmitting the signal from a first optical frequency transceiver disposed within the rotating mechanism to a second optical frequency transceiver disposed outside of the rotating mechanism.

22. A method as defined in claim 14, wherein the step of energizing includes adjustably generating a DC voltage potential from approximately 200 volts to approximately 10 kilovolts between the electrode and the twisted insulated conductors.

23. A method as defined in claim 14, further comprising the step of detecting an increase in current across terminals of the high voltage power supply indicative of a fault in the insulation of the twisted insulated conductors being tested by the electrode and thereupon generating the information representative of fault detection characteristics of the twisted insulated conductors.

24. A method as defined in claim 14, wherein the fault detection characteristics include at least one of pin hole faults, bare wire intervals, whether the detected faults exceed a predetermined number, and whether the detected faults exceed a predetermined number per unit length of the twisted insulated conductors being tested.

25. A method as defined in claim 14, further comprising the step of activating at least one of an audible alarm and a visual alarm when faults have been detected or a predetermined number of faults has been exceeded.

* * * * *

UNITED STATES PATENT AND TRADEMARK OFFICE
CERTIFICATE OF CORRECTION

PATENT NO. : 6,977,509 B2
DATED : December 20, 2005
INVENTOR(S) : David L. Carroll et al.

It is certified that error appears in the above-identified patent and that said Letters Patent is hereby corrected as shown below:

Column 5,
Line 46, delete "form" and replace with -- from --.

Signed and Sealed this

Fourth Day of April, 2006

JON W. DUDAS
*Director of the United States Patent and Trademark Office*